(12) United States Patent
Aoki et al.

(10) Patent No.: US 6,890,391 B2
(45) Date of Patent: May 10, 2005

(54) METHOD OF MANUFACTURING SEMICONDUCTOR DEVICE AND APPARATUS FOR CLEANING SUBSTRATE

(75) Inventors: Hidemitsu Aoki, Kanagawa (JP); Yoshiko Kasama, Kanagawa (JP); Tatsuya Suzuki, Kanagawa (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/680,216

(22) Filed: Oct. 8, 2003

(65) Prior Publication Data

US 2004/0074526 A1 Apr. 22, 2004

(30) Foreign Application Priority Data

Oct. 17, 2002 (JP) ...................................... 2002-303629

(51) Int. Cl.[7] .............................................. B08B 3/04
(52) U.S. Cl. .............................. 134/32; 134/2; 134/26; 134/30; 134/31; 134/33; 134/34; 134/36; 134/37; 134/38; 134/42; 134/902
(58) Field of Search .............................. 134/2, 26, 30, 134/31, 32, 33, 38, 34, 36, 37, 42, 902

(56) References Cited

U.S. PATENT DOCUMENTS 3,957,531 A * 5/1976 Tipping et al. ............... 134/11
6,430,840 B1 * 8/2002 Jung ............................ 34/468
2004/0000330 A1 * 1/2004 Kwon et al. .............. 134/102.2
2004/0074526 A1 * 4/2004 Aoki et al. .................... 134/36

FOREIGN PATENT DOCUMENTS

| JP | 11-204491 | 7/1999 |
| JP | 11-214350 | 8/1999 |
| JP | 2000-058498 | 2/2000 |

* cited by examiner

Primary Examiner—Sharidan Carrillo
(74) Attorney, Agent, or Firm—Dickstein, Shapiro, Morin & Oshinsky, L.L.P.

(57) ABSTRACT

The stripping agent is sprayed from the tip of the nozzle 33 onto the wafer surface, while the first supply nozzle 33 is actuated to scan from the central portion of the wafer to the outer portion thereof. This operation provides the situation, in which the interface of the residual droplet 38 is pulled back from the center of the wafer to the outer portion of the wafer by the surface tension of the stripping agent supplied from the nozzle. Meanwhile, the second supply nozzle 36 also scans at a same scanning speed as the first supply nozzle 33 scans. Vapor IPA is sprayed from the orifice of the second supply nozzle 36. This provides that vapor IPA is sprayed onto the wafer surface immediately after the stripping agent is sprayed thereon from the first supply nozzle 33, and the residual stripping agent on the wafer surface is efficiently replaced with IPA.

10 Claims, 14 Drawing Sheets

Fig. 11A

|  | stripping agent | pure water rinse | spray liquid IPA scanning | nozzle scanning vapor IPA + liquid | nozzle scanning vapor IPA + | nozzle scanning vapor IPA drying | N₂ gas dry (spinning drying) |
|---|---|---|---|---|---|---|---|
| No. 1 (Comparative Example) | 1 | 2 |  |  |  |  | 3 |
| No. 2 | 1 |  | 2 |  |  |  | 3 |

Fig. 11B

|  | stripping agent | pure water rinse | spray liquid IPA scanning | nozzle scanning vapor IPA + liquid | nozzle scanning vapor IPA + stripper | nozzle scanning vapor IPA drying | N₂ gas dry (spinning drying) |
|---|---|---|---|---|---|---|---|
| No. 3 (Comparative Example) | 1 |  |  | 2 (DIW) |  |  | 3 |
| No. 4 | 1 |  |  |  | 2 |  | 3 |

Fig. 11C

|  | stripping agent | pure water rinse | spray liquid IPA scanning | nozzle scanning vapor IPA + liquid | nozzle scanning vapor IPA + stripper | nozzle scanning vapor IPA drying | N₂ gas dry (spinning drying) |
|---|---|---|---|---|---|---|---|
| No. 5 (Comparative Example) | 1 | 2 |  |  |  | 3 |  |
| No. 6 | 1 |  | 2 |  |  | 3 |  |
| No. 7 | 1 |  |  |  | 2 | 3 |  |
| No. 8 | 1 |  | 2 |  |  | 3 | 4 |
| No. 9 | 1 |  |  | 2 (electrolyte-containing water) |  |  | 3 | upper surface cross section pitch spacing

METHOD OF MANUFACTURING SEMICONDUCTOR DEVICE AND APPARATUS FOR CLEANING SUBSTRATE

This application is based on Japanese patent application NO.2002-303629, the content of which is incorporated hereinto by reference.

BACKGROUND OF THE INVENTION

1. Field of the Invention

The present invention relates to a technique for cleaning a semiconductor substrate.

2. Description of the Related Art

Formation of a through-hole or an interconnect trench in a manufacturing process for LSI is generally carried out using a lithography technique and a cleaning technique. A typical process includes steps of: forming a resist pattern on an insulating layer and subsequently dry-etching the insulating layer using the resist pattern as a mask; and then removing the resist pattern by ashing the resist pattern and spraying a stripping solution onto the resist pattern. Further, a rinse is then carried out using a selected solvent. The rinse is carried out to remove residual materials resulting from the resist removal in order to keep the substrate surface clean and thus the rinse is the important processing that affects the reliability of the resultant semiconductor devices.

Following technologies related to a rinse step are conventionally known.

JP-A-H11-214,350 discloses a typical batch type rinse technique. The technique will be described below with reference to FIG. 12. As shown in FIG. 12, an apparatus for processing and drying of substrate comprises a processing bath 103 containing therein warm pure water (at a temperature of approximately 60 degree. C.) as a processing solution 101. The apparatus further comprises a conveyer (not shown) for holding and conveying a carrier 107 on which a plurality of silicon wafers 105 are vertically mounted. The conveyer transfers the individual silicon wafers 105 into the processing solution 101 to dip the wafers into the solution and then retrieves the wafers therefrom.

In the apparatus for processing and drying of substrate, when the carrier 107 holding the silicon wafers 105 is lowered as indicated by an arrow Z1 upon actuation of the aforementioned conveyer, the individual silicon wafers 105 are dipped into the processing solution 101. Dipping the silicon wafers 105 into the processing solution 101 rinses the wafers. Upon completion of the rinse, the aforementioned conveyer removes from the solution 101 the carrier 107 in the direction indicated by an arrow Z2 at a relatively low speed (e.g., 1 mm/sec.). As is apparent from FIG. 13, removing the wafers at the relatively low speed removes from the surface of the silicon wafer 105 the processing solution adhered to the surface thereof, so that the solution adhered thereto is pulled back by the surface tension of the solution to the side of the processing solution 101 within a processing bath 103 (pulling force is indicated by an arrow p1). As such, removal of the wafers from the solution simultaneously terminates the drying of the silicon wafers 105.

JP-A-H11-204,491 discloses another bath-type cleaning technique. The publication discloses a technique for rinsing a substrate with ultra pure water and then drying the substrate with isopropyl alcohol (hereinafter abbreviated as IPA).

Although the above described techniques for rinsing wafers in a Batch Wafer Processing Equipment, various other techniques for rinsing wafers in a Single Wafer Processing Equipment. JP-A-2000-58,498 discloses a technique for rinsing wafers in a Batch Wafer Processing Equipment. The publication describes a method for rinsing a substrate with ultra pure water and spraying isopropyl alcohol (IPA) onto a surface of the substrate to dry the surface thereof.

As described in the above-listed publications, a rinse step is performed using an ultra pure water after a wet etch step. In some cases, as described in JP-A-H11-204,491 and JP-A-2000-58,498, a rinse step is performed using an organic solvent such as IPA in addition to ultra pure water. However, in the latter case, the organic solvent is used only in a dry step after the rinse step is performed using ultra pure water, meaning that both the former and latter cases employ the ultra pure water to rinse a substrate.

The inventors of the present invention have found that when a semiconductor substrate is rinsed with an ultra pure water, the semiconductor substrate is charged with an electrical charge because of high electrical resistivity of the ultra pure water and thus a metal film and/or an insulating film formed on the substrate are damaged.

Further, rinsing a substrate with an ultra pure water takes a long period of time to remove residual materials from the surface of substrate and dry the substrate after the rinsing, thereby decreasing the throughput of substrate.

Problems specifically related to the technique for rinsing wafers in a Batch Wafer Processing Equipment and the technique for rinsing wafers in a Single Wafer Processing Equipment are described below. That is, rinsing wafers in a Batch Wafer Processing Equipment requires a significant amount of rinse agent, thereby increasing production cost and environmental load. Moreover, rinsing wafers with an ultra pure water in a Single Wafer Processing Equipment further increases potential of charging-up of the substrate surface by the friction between the ultra pure water and the substrate, thereby decreasing the production yield.

In consideration of the above-stated problems found in the conventional techniques, the present invention has been conceived to solve those problems. Therefore, it is an object of the present invention to prevent damages that are applied during a cleaning step to a metal film and an insulating film formed on the substrate. It is another object of the present invention to provide a method for efficiently removing residual materials from the surface of substrate and after cleaning of the substrate, efficiently drying the substrate, thereby allowing increase in the throughput of substrate. It is yet another object of the invention to reduce production cost and environmental load in a cleaning step while increasing production yield.

SUMMARY OF THE INVENTION

According to the present invention, there is provided a method of manufacturing a semiconductor device, comprising: (a) cleaning in a Single Wafer Processing Equipment a surface of a semiconductor substrate not using ultra-pure water rinse but using a cleaning agent containing one of a chemical solution having an organic solvent as a main component and a vapor of said solution. According to one aspect of the present invention, said method may further comprise, before the step (a), (b) forming a film on said semiconductor substrate and (c) partially removing said film. The available type of film for the present invention is not particularly limited, and a metallic film, an insulating film, a resist film and the like may be employed.

According to one aspect of the present invention, said method may further comprise, before the step (a), (d)

depositing a metal film and an insulating film on the semiconductor substrate in this order and (e) partially removing said insulating film to expose at least a part of a surface of said metal film.

The exemplary metallic film for the present invention may be a metallic film constituting interconnects, plugs, pads or the like, and exemplary materials for the film may be a copper containing metal such as copper, copper-silver alloy or the like.

According to the present invention, the ultra pure water is not used in the single wafer cleaning, but the cleaning agent that contains a chemical solution containing the organic solvent as main component or vapor of the chemical solution is used. This configuration provides inhibiting damages to the semiconductor substrate and/or the metallic film or the insulating film formed on the surface of the semiconductor substrate in the cleaning. In addition, the configuration also provides inhibiting the charging-up induced by the friction between the ultra pure water and the substrate, thereby improving the production yield. Further, the configuration also significantly reduce the amount of the cleaning agent used in the cleaning, thereby enabling the reduction of the production cost and the environmental load.

Further, since the cleaning according to the present invention employs the single wafer processing, the available manner of cleaning may include a manner of spraying a cleaning agent or the like while the semiconductor substrate is rotated, as stated later. Thus, this aspect is also useful in reducing the amount of the cleaning agent used in the cleaning and improving the production yield.

Here, the term "cleaning (processing)" used in the present invention generally includes any processing for cleaning the substrate surface by using a chemical solution or vapor thereof, and additionally includes a processing of removing contaminants from the substrate surface or removing chemical solutions or the like that is employed in the previous processing, and a processing of chemically or physically modifying the contaminants for facilitating to remove the modified contaminants in the subsequent processing. More specifically, the cleaning includes a stripping processing for the resist and/or mask material, a rinse processing conducted after an ashing processing or the stripping processing, and removing processing for removing etch residual materials.

According to one aspect of the present invention, the step (a) may include (f) spraying said cleaning agent on said surface of said semiconductor substrate while rotating said semiconductor substrate. Having this configuration, the cleaning efficiency can be improved and more over the time required for drying can be reduced, since the residues on the substrate surface can be efficiently removed with smaller amount of the cleaning agent. As such, this configuration enables the efficient cleaning. In particular, when the cleaning agent is selected to include vapor of an organic solvent as a main component, efficient cleaning can be provided by selecting this configuration.

More particularly, in the step (f), said cleaning agent may be sprayed onto said surface of said semiconductor substrate while a portion to be sprayed is moved from a center of said substrate to a periphery of said substrate. Having this particular configuration, the cleaning efficiency can be considerably improved, since the residues on the substrate surface can be removed with higher efficiency.

According to one aspect of the present invention, the step (a) may be performed as a rinse step after wet process using a chemical solution and wherein the step (a) may include (g) simultaneously spraying a liquid having resistivity lower than that of pure water and said cleaning agent onto said surface of said substrate, and wherein in the step (g), portions to be sprayed with said cleaning agent and said liquid may be moved from a center of said substrate to a periphery of said substrate while said portion to be sprayed with said cleaning agent is kept nearer said center of said substrate than said portion to be sprayed with said liquid.

The manufacturing method having this configuration is an applied method of so-called Rotagoni™ drying technique, and the processing proceeds as follows. The interface of the residual matter, e.g., residual chemical solution, which is remained on the semiconductor substrate surface after the wet processing, is pulled back from the center of the substrate to the outer portion of the substrate by the surface tension of the aforementioned liquid having lower resistivity than the pure water. Meanwhile, the cleaning agent is sprayed at the position closer to the center of the substrate than the sprayed position of the aforementioned liquid having lower resistivity than the pure water. This configuration achieves a condition of any portion of the semiconductor substrate surface, on which the cleaning agent is sprayed immediately after the portion is cleaned by the cleaning agent, and thus the cleaning for achieving higher cleanliness can be efficiently conducted. Here, the aforementioned liquid having lower resistivity than the pure water may be an organic solvent or water containing electrolytes. The available organic solvent may be alcohols, ethers, ketones or the like, and the organic solvent, which is in common with the main component of the cleaning agent of the present invention, may also be employed. The water containing electrolytes may be carbonated water, weak ammonia water solution, weak ammonia and hydrogen water solution, electrolyzed cathode water solution or the like.

The semiconductor substrate according to the present invention may comprise: an element semiconductor such as Si, Ge, or the like; a compound semiconductor such as GaAs, InP, CdS, SiC, or the like; or a mixed crystal semiconductor such as InGaAs, HgCdTe or the like. Among these semiconductors, selecting silicon wafer for the semiconductor substrate provides considerable advantageous effects of the present invention.

The present invention provides a considerable advantageous effect over the conventional technique, when the present invention is applied to the situation in which the semiconductor material is exposed on the surface of the semiconductor substrate. More specifically, when pure water is used in the cleaning for the surface having exposed semiconductor material, the exposed semiconductor material may be damaged and/or a watermark may be generated thereon, which lead to a reduction of the production yield. The present invention is useful in effectively solving these problems. In addition, the present invention also provides a considerable advantageous effect over the conventional technique, when the present invention is applied to the situation in which a metallic film is exposed on the surface of the semiconductor substrate. More specifically, when pure water is used in the cleaning for the surface having exposed metallic film, the metal may be eluted or damaged, which lead to a reduction of the production yield, and the present invention is useful in effectively solving these problems.

According to one aspect of the present invention, the method may comprise a step of drying the surface of the semiconductor substrate by rotating the semiconductor substrate within an inert gas atmosphere after completing the cleaning. This configuration provides spinning the residual solution and the like off the substrate surface by the centrifugal force, thereby completing the drying processing in a short period of time.

According to the present invention, there is provided an apparatus for cleaning a substrate, comprising: a substrate pedestal for holding and rotating a semiconductor substrate; a first supply port for supplying a liquid having resistivity lower than that of pure water to a surface of said semiconductor substrate; a second supply port for supplying a vapor of a cleaning agent to said surface of said semiconductor substrate; a third supply port for supplying a chemical solution to said surface of said semiconductor substrate; and a moving member for moving said first and second supply ports from a central portion of said semiconductor substrate to a peripheral portion thereof while keeping said second supply port closer to said central portion of said substrate than said first supply port.

The above-described apparatus includes first, second and third supply ports, each port being provided to supply a chemical solution or a vapor of solution different those supplied by other supply ports. Furthermore, the apparatus includes a conveyer for moving the first and second supply ports from the central portion of the semiconductor substrate to the peripheral portion thereof. This allows the aforementioned cleaning that utilizes the Rotagoni™ drying technique to preferably be performed and further permits chemical processing such as etching, resist removal and subsequent rinse to be performed by only one apparatus. Moreover, this enables various combinations of operations involving, for example, utilizing together liquid and vapor as a cleaning agent. The first, second and third supply ports of the inventive apparatus can be used in the following combinations:

All the first, second and third supply ports,
The first and second supply ports,
The first and third supply ports.

The third supply port may be fixedly provided at a specific position relative to the substrate pedestal. More specifically, the first and second supply ports may be movably provided and the third supply port may be fixedly provided. In this case, the third supply port is preferably provided so as to be able to spray the central portion of the semiconductor substrate.

The apparatus according to one aspect of the invention may further comprise a fourth supply port for supplying another chemical solution. The fourth supply port may be, for example, disposed adjacent the third supply port. Preferably, the fourth supply port may be fixedly provided, and the fourth supply port may preferably be provided so as to be able to spray the central portion of the semiconductor substrate. The sequence No. 6 later described in the explanation of the preferred embodiments can be carried out by the above-described apparatus.

BRIEF DESCRIPTION OF THE DRAWINGS

FIGS. 11A to 11C are tables indicating the processing sequences of the preferred embodiments;

DETAILED DESCRIPTION OF THE PREFERRED EMBODIMENTS

Figure 1A:
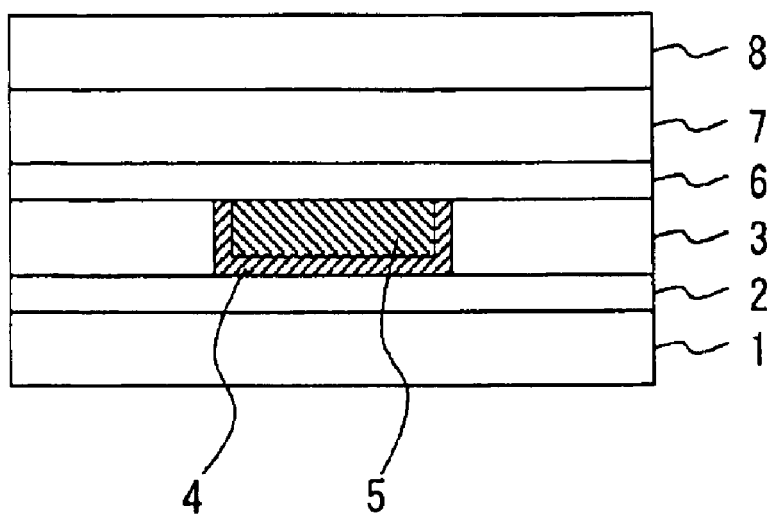
FIGS. 1A to 1C are schematic sectional views of the semiconductor substrate, showing an example of the processing steps described in a preferred embodiment according to the present invention.

Metal interconnects are formed on a semiconductor substrate using, in many cases, plasma processing such as sputtering, plasma CVD (chemical vapor deposition), dry etching, plasma ashing. In these processing, interconnect layers and/or interlayer insulation films on the semiconductor substrate are exposed to plasma and then potentially charged with an electrical charge. When the extent to which those components are charged with an electrical charge becomes large, undesirable phenomena occur. That is, when the interconnect layer and water becomes in contact with each other, the electrical charge accumulated in the interconnect layer is released all at once to ionize a metal making up the interconnect layer and then elute the metal, or make the metal susceptible to oxidation after drying of the substrate.

Such phenomena are frequently observed in the following cases. That is, when a semiconductor substrate includes an interconnect region having large area interconnects and an interconnect extension region having relatively small area interconnects and extended from the interconnect region, larger the area of the interconnect region is, more prominently the metal making up vias formed in the interconnect extension region is eluted.

Further, when the interconnects are not connected to the semiconductor substrate, i. e., being in a floating state, the elution of the metal from vias more prominently occurs. Elution and/or oxidation of the metal within vias deteriorates connection between the via conductors and the overlying interconnects, thereby reducing reliability of semiconductor device.

These technical findings are the very original one the inventors of the invention have investigated and therefore, in consideration of the above-stated phenomena, the method according to the present invention is intended not to include cleaning a semiconductor substrate with the pure water.

A cleaning agent employed in the present invention includes a chemical solution containing an organic solvent as a main component or vapor of the chemical solution. Note that the term "main component" means the component having the largest weight content in the cleaning agent. The cleaning agent may be a single chemical solution, a single vapor or a mixture thereof. The organic solvent may preferably have a polar functional group. In this case, the polar group may be: hydroxyl group; ether bond group; carbonyl group; carboxylic group or the like. The available solvent having polar group may be: alcohols such as isopropyl alcohol, isobutyl alcohol, ethylene glycol, t-butyl alcohol or the like; ethers such as glycol ether, propylene glycol monomethyl ether or the like; ketones such as cyclopentanone, cyclohexanone, 2-heptanone, methylethylketone or the like.

Among these, one or more selected from the group consisting of isopropyl alcohol, ethylene glycol, cyclopentanone, methylethylketone and glycol ether should preferably be contained in the solvent, and isopropyl alcohol should more preferably be contained in the solvent. The use of such solvent efficiently removes residues on the surface of semiconductor substrate. Note that the cleaning agent may contain water or various additives in addition to the organic solvent.

The cleaning according to the present invention may preferably be applicable to, for example, the following processing:

(i) A cleaning after ashing a resist on a substrate and then cleaning the surface of the substrate with a resist stripper, (ii) A cleaning performed to remove contaminants adhered to the surface of a semiconductor substrate after removal of a film on the semiconductor substrate.

Preferred embodiments according to the present invention will be described in detail below with reference to the attached drawings.

1. First Embodiment

In this embodiment, the present invention is applied to a rinse step after through-holes are opened using a resist and the resist is removed by a resist stripper.

First, as shown in FIG. 1A, a silicon oxide film 1, silicon nitride film 2 and silicon oxide film 3 are deposited on a silicon wafer (not shown) and a copper interconnect comprising a barrier metal layer 4 and a copper film 5 is formed by a known damascene process utilizing chemical mechanical polishing (CMP) technique. Additionally, a silicon nitride film 6 having a thickness of about 50 to 100 nm and a low dielectric constant film 7 having a thickness of about 250 to 500 nm are deposited thereon, and further, a silicon oxide film 8 having a thickness of about 250 to 500 nm is deposited thereon. The thickness of the copper film 5 may be arbitrarily selected and preferably be not larger than, for example, 350 nm.

The low dielectric film 7 may be: methyl silsesquioxane (MSQ) film; hydro silsesquioxane (HSQ) film; SiOC film (referred to also as SiOCH film); a film formed of various organic materials; a film containing ladder-shaped hydrogenated siloxane or the like; or a porous film formed from one of the aforementioned films. Note that "ladder shaped hydrogenated siloxane" is polymer having a ladder-shaped molecular structure and the polymer having a dielectric constant of not higher than 2.9 and lower film density may preferably be employed in view of preventing interconnect delay. In this case, the film density may preferably be from 1.50 g/cm$^3$ to 1.58 g/cm$^3$. In more detail, a material making up the above-described films may be L-Ox™, commercially available from NEC Corporation, Tokyo Japan.

In the interconnect structure shown in FIG. 1A, the silicon nitride film 6 may be replaced with a silicon oxynitride film. Further, the silicon oxide film 1 and/or silicon oxide film 3 may be replaced with the low dielectric film described above. When the silicon oxide film 3 is replaced with the low dielectric film, a protection film formed of $SiO_2$, SiCN, SiN or the like is preferably formed on the surface of the low dielectric film. In this case, the protection film and the copper film 5 are formed to have upper surfaces at the same level.

Figure 1B:
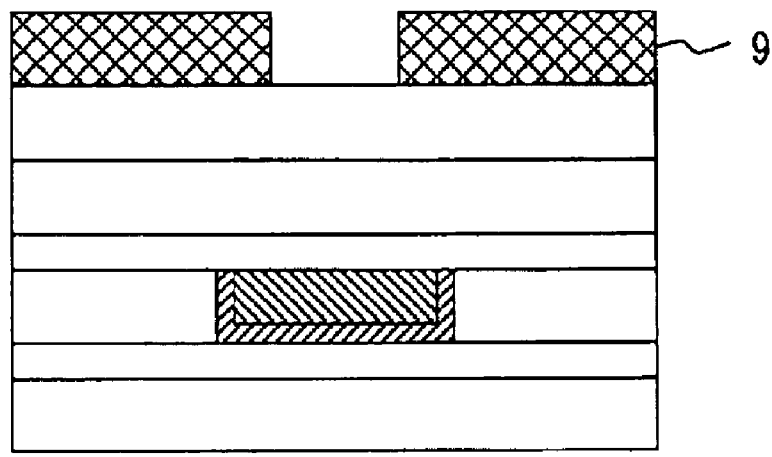

Next, a resist film 9 having a patterned profile is formed on the silicon oxide layer 8 (FIG. 1B).

Figure 1C:
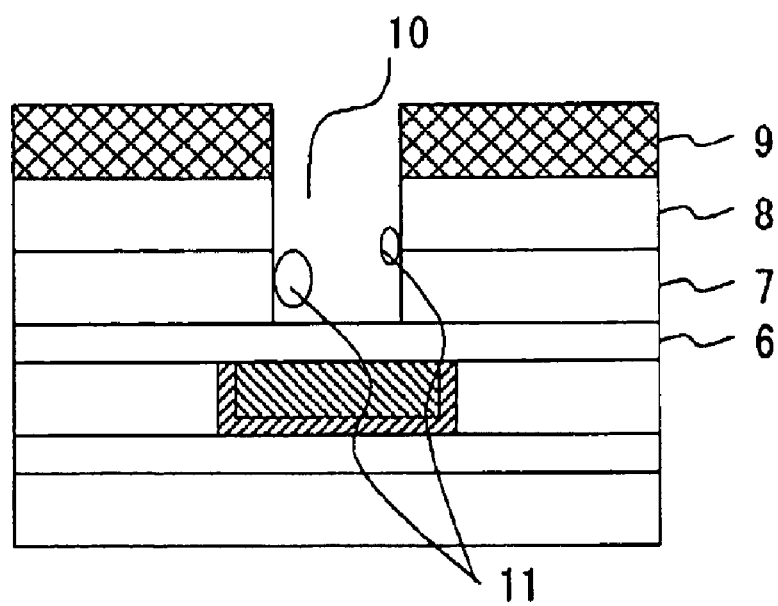

Then, the silicon oxide film 8 and the low dielectric film 7 are dry-etched using the resist film 9 as a mask to expose the silicon nitride film 6 to form a via hole 10 (FIG. 1C). In this case, etching residues 11 are adhered to the inner sidewall of the via hole 10. The diameter of the via hole 10 may be, for example, about 0.2 μm. Preferably, an etching gas is used for etching a silicon oxide film at a rate larger than a rate at which a silicon nitride film is etched.

Figure 2A:
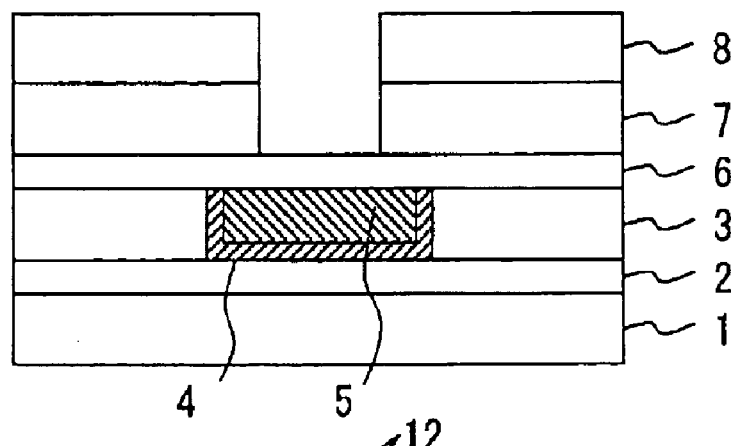
FIGS. 2A to 2D are schematic sectional views of the semiconductor substrate, showing an example of the processing steps described in a preferred embodiment according to the present invention.

After completion of the etching, the resist film 9 is partially removed by oxygen plasma ashing, $N_2$—$H_2$ gas plasma ashing or He—$H_2$ gas plasma ashing and thereafter, removed by by a resist stripper. The resist material and the etching residues 11 left on the associated portions even after removal of the resist film can be removed by the stripping (FIG. 2A).

Figure 2B:
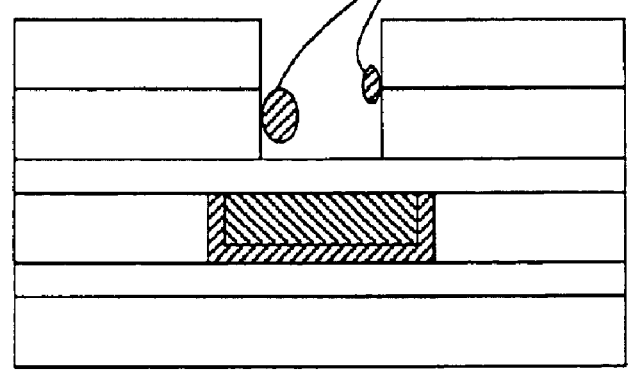
Figure 2C:
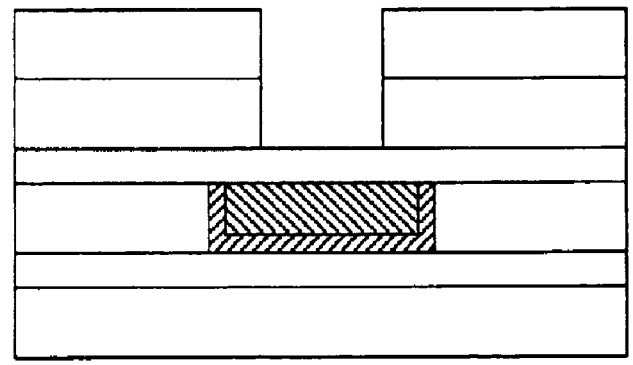

Thereafter, the etching gas is replaced with another one to etch the silicon nitride film 6. At this time, etching residues 12 are adhered to the inner sidewall of the via hole 10 (FIG. 2B). In order to remove the etching residues 12, the above-mentioned stripping agent is again used and then a rinse is carried out (FIG. 2C).

In the stripping, the stripping agent may be any of amine-based stripping agents, carboxylic acid-based stripping agents and hydrofluoric acid-based stripping agents. The amine-based stripping agents may be a compound of one or more selected from the group consisting of: 1-aminno-2-propanol; 2-aminno-1-propanol; 3-aminno-1-propanol; 2-methylaminoethanol; 2-amino-2-aminno-2-methyl-1-propanol; 2-diethylaminoethanol; monoethanol amine; diethanol amine; triethanol amine; 2-(2-aminoethoxy) ethanol; 2-(2-aminoethylamino) ethanol; 2-(diethylamino) ethanol; 2-di(methylamino) ethanol; choline; morpholine; diethylenetriamine and triethylenetetramine.

The carboxylic acid-based stripping agent may be aqueous solution containing oxalic acid or malonic acid.

The hydrofluoric acid-based stripping agent may be diluted hydrofluoric acid (DHF) and buff red hydrofluoric acid (BHF), and further, a solution containing hydrofluoric acid salt such as ammonium fluoride.

The rinse after the stripping is conducted as follows.

Figure 3A:
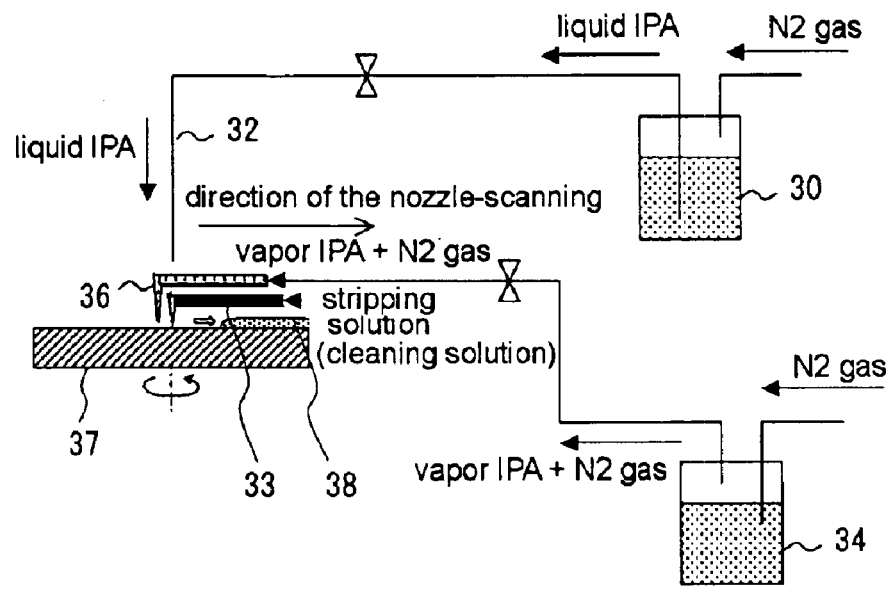
FIG. 3A is a schematic diagram of a cleaning apparatus employed in the preferred embodiments according to the present invention.
Figure 3B:
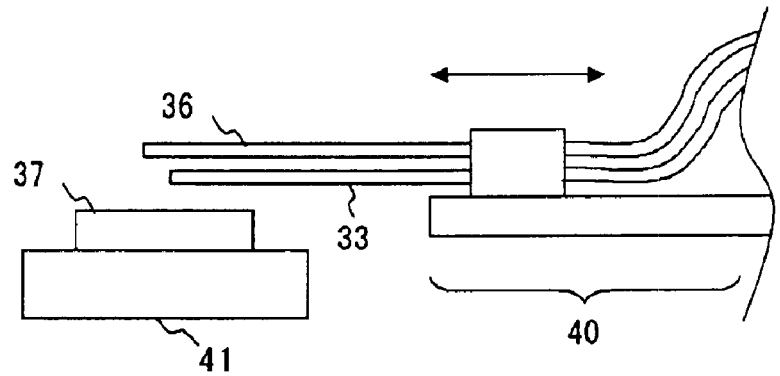
FIG. 3B is a schematic diagram of a susceptor and inlet nozzles, showing a spatial relationship of the nozzles and the substrate held on the susceptor.
Figure 4A:
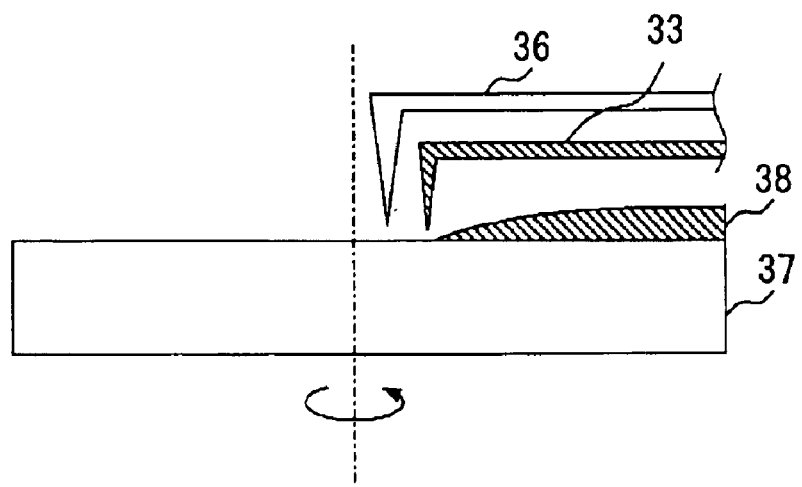
FIGS. 4A and 4B show a silicon wafer and nozzles, showing the operation of the nozzles during the cleaning.
Figure 4B:
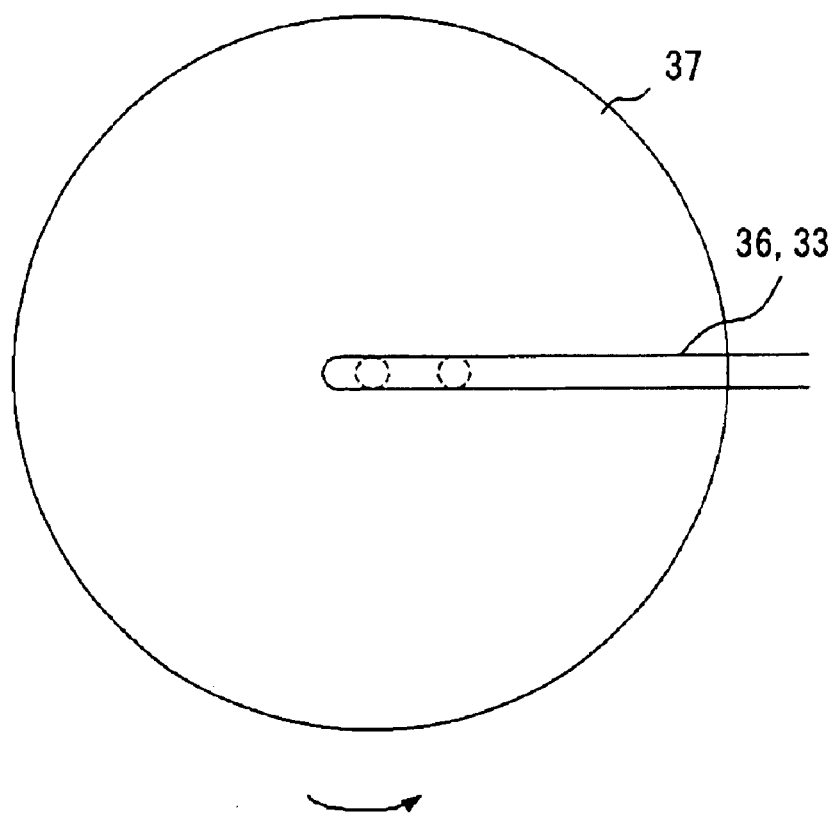

FIGS. 3A and 3B are schematic diagrams showing an apparatus employed in a rinse step after a stripping step. FIG. 3A shows a supply system for supplying a chemical solution or the like to a wafer and FIG. 3B shows an actuator system for actuating nozzles. FIGS. 4A and 4B show enlarged view of a part of the apparatus around the wafer.

A silicon wafer 37 shown in FIGS. 3A, 3B, 4A and 4B is in a state after the stripping in the resist stripper as shown in FIG. 2C. The silicon wafer 37 has a droplet 38 of the stripper left on the surface thereof. In this embodiment, the residual droplet 38 is removed by rinse which utilizes the Rotagoni™ drying technique. The apparatus has provided therein a first supply nozzle 33 and a second supply nozzle 36, and further, a third supply nozzle 32. The second supply nozzle 36 is positioned closer to the central portion of the substrate than the first supply nozzle 33.

The silicon wafer 37 is rotated at high speed while generally horizontally being held on a wafer pedestal 41 shown in FIG. 3B. The rotational frequency may be suitably selected in accordance with the purpose of processing. The rotational frequency would be as follows:

During processing with the cleaning (stripping) agent: 200 to 1,000 rpm;
During rinse with liquid IPA: 200 to 1,000 rpm;
During rinse with vapor IPA: 500 to 1,000 rpm; and
During drying with $N_2$: 1,500 to 2,000 rpm.

The first supply nozzle 33 supplies a liquid stripper that is the same type as that of the droplet 38. A nozzle actuator shown in FIG. 3B actuates the first supply nozzle 33 to move the nozzle 33 from the center of the wafer to the periphery thereof. In response to the movement of the nozzle 33, the liquid stripper is sprayed from the tip of the nozzle 33 onto the wafer surface while a portion to be sprayed is moved from the center of the wafer to the periphery thereof. This moves the internal edge of the residual droplet 38 from the center of the wafer to the periphery thereof, which movement is due to the surface tension of the liquid stripper supplied from the nozzle. Meanwhile, the second supply nozzle 36 also moves at the same speed as that of the first supply nozzle 33. The second supply nozzle 36 sprays from the orifice thereof a mixture of vapor IPA (isopropyl alcohol) supplied from an IPA container 34 and nitrogen gas. Since the second supply nozzle 36 is positioned closer to the center of the wafer than the first supply nozzle 33, vapor IPA is sprayed onto the wafer surface immediately after the liquid stripper is sprayed thereon from the first supply nozzle 33. Consequently, the liquid stripper left on the wafer surface is efficiently replaced with IPA. After movement of the first and second supply nozzles 33, 36 from the center of the wafer to the periphery thereof, those two nozzles again return to the center of the wafer and repeat the same movement. As described above, operation for spraying the liquid stripper and vapor IPA on the wafer while moving these nozzles is repeated 2 or 3 times, thereby performing a complete cycle of rinse.

Figure 2D:
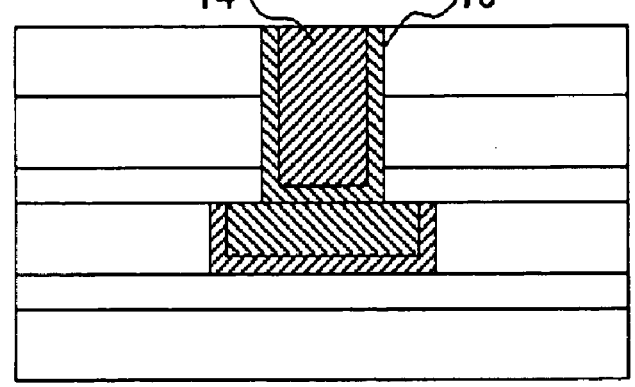

Thereafter, a barrier metal film 13 to be formed by laminating a Ti film and TiN film in this order and a copper film 14 are deposited and planarized using CMP to form a connection plug between different levels of interconnects (FIG. 2D).

Figure 5:
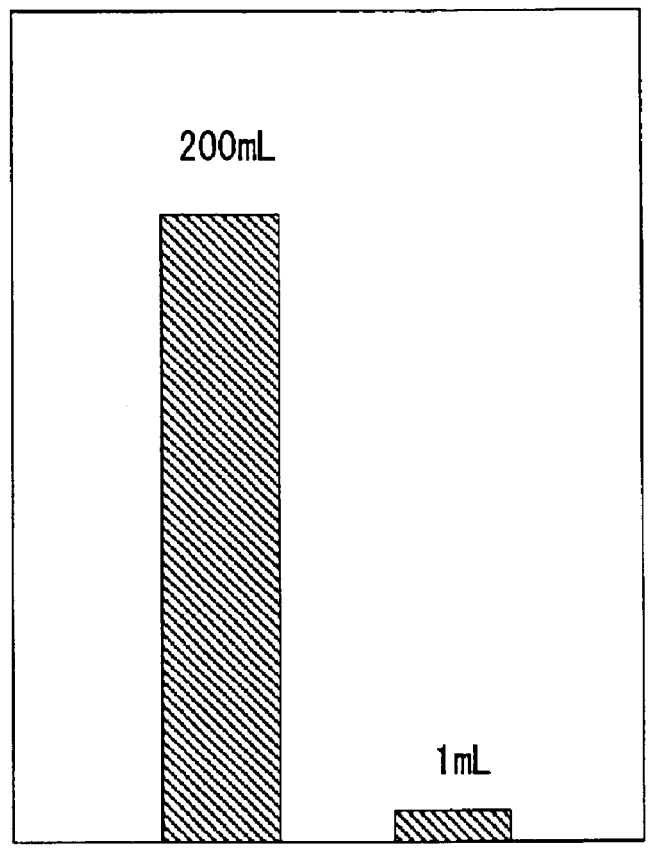
FIG. 5 is a graph of the amounts of consumed isopropyl alcohol per one substrate.

In the method according to the present embodiment, rinse is carried out in a Single Wafer Processing Equipment and vapor IPA is used as a rinse agent. This allows a significant reduction in the amount of IPA used for rinse, and increase in the overall efficiency of the rinse cycle and dry cycle, leading to removal of the residual component on the wafer surface in a short period of time. FIG. 5 is a graph showing the comparison between the amounts of isopropyl alcohol (IPA) consumed per waferin the case where the wafer is dipped into IPA in the conventional Batch Wafer Processing Equipment and the case where the wafer is rinsed according to the method of the present embodiment. As can be seen from the figure, the method according to the present embodiment enables significant reduction in the amount of the IPA consumed for rinse, compared to the conventional method (concentrated IPA method).

Figure 6:
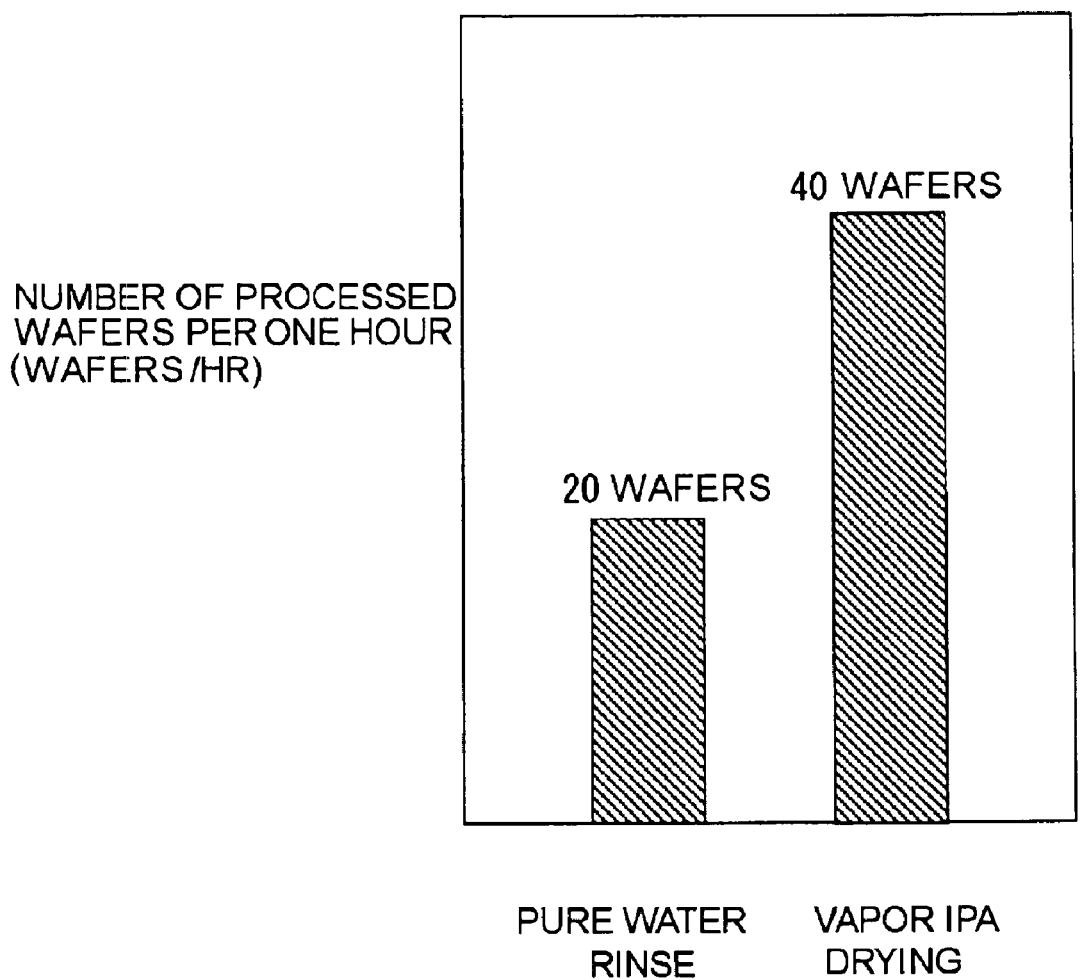
FIG. 6 is a graph of the number of the substrates processed in one hour.

Further, in the method according to the present embodiment, pure water having high resistivity is not used and rinse with a liquid stripper and subsequent drying with vapor IPA are carried out. The liquid stripper includes much electrolytes and therefore, has resistivity lower than the pure water. This prevents associated components from charging up due to friction between pure water and a wafer, and copper elution, generation of the dendrite and further, generation of the watermark. FIG. 6 is a graph showing the comparison between the production yields corresponding to the case where wafers are rinsed with the pure water in a Single Wafer Processing Equipment and the case where wafers are rinsed with IPA in a Single Wafer Processing Equipment. As can be seen from FIG. 6, the rinse with vapor IPA enables handling approximately twice the number of wafers per hour (substrates/hr) compared to the rinse with pure water. This is because the rinse with vapor IPA provides a higher efficiency of replacement of residues with a rinse agent and a higher rate of drying of the rinse agent, compared to the rinse with pure water.

As described above, the method according to the present invention allows higher yield in production of highly reliable semiconductor device.

In the above embodiment, the rinse is carried out using vapor IPA. Alternatively, the rinse may be carried out using together vapor IPA and liquid IPA. In this case, the third supply nozzle 32 supplies liquid IPA to the surface of the silicon wafer 37 to rinse the wafer with liquid IPA. Next, the nozzles 33 and 36 are moved to rinse the wafer as described above. This further ensures removal of the residues from the wafer surface. The apparatus shown in FIG. 3A includes the third supply nozzle 32, the first supply nozzle 33 and the second supply nozzle 36, and therefore, is able to perform the above-described various rinses by itself.

2. Second Embodiment

The embodiment illustrates the case where a transistor is formed in a device formation region of a substrate and the substrate is rinsed using the method according to the invention after formation of a gate of the transistor. A process according to the present embodiment will be described with reference to FIGS. 7A–D and 8A–D.

Figure 7A:
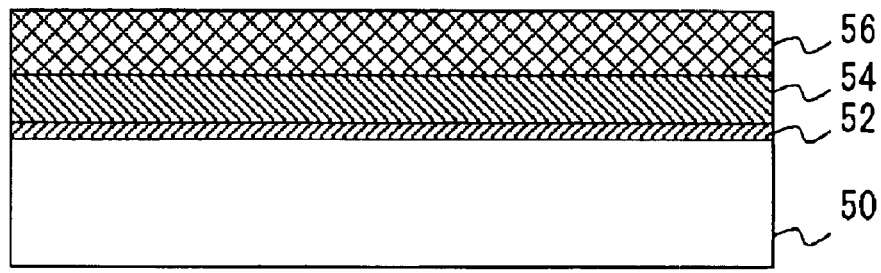
FIGS. 7A to 7D are schematic sectional views of the semiconductor substrate, showing an example of the processing steps described in a preferred embodiment according to the present invention.

First, as shown in FIG. 7A, a silicon substrate 50 is thermally oxidized to form a silicon oxide film 52 on the silicon substrate 50 and a high dielectric constant (high-k) insulating film 54 is deposited thereon by CVD or sputtering, and further, a polysilicon layer 56 is deposited thereon by CVD.

Figure 7B:
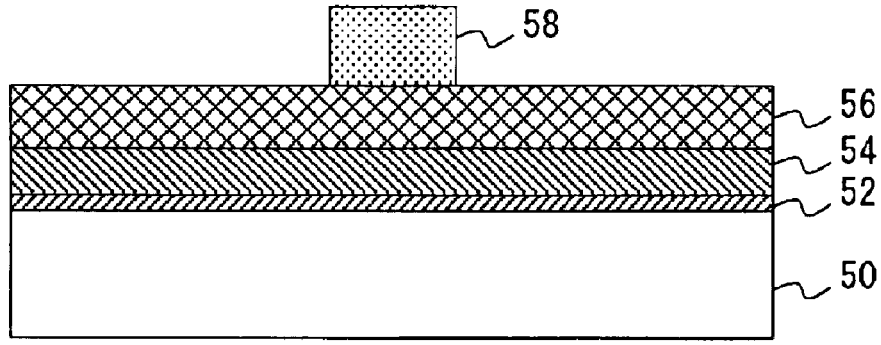
Figure 7C:
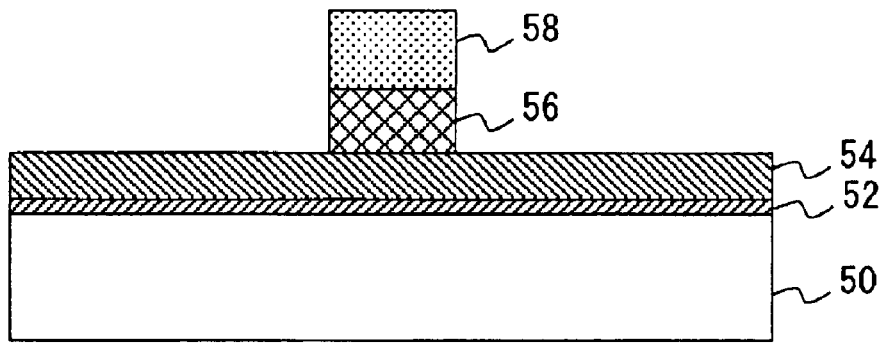
Figure 7D:
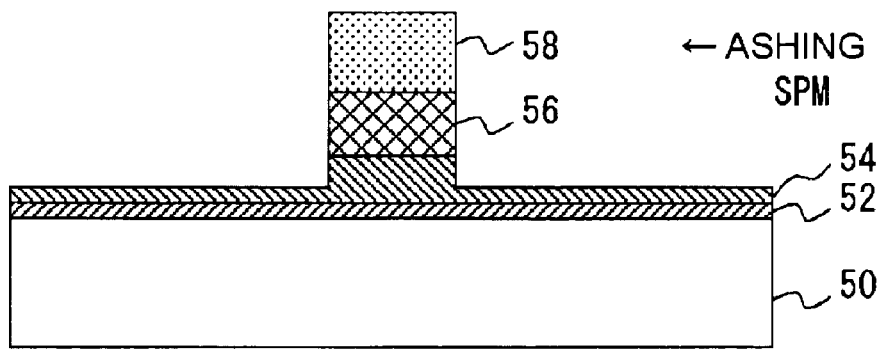
Figure 8A:
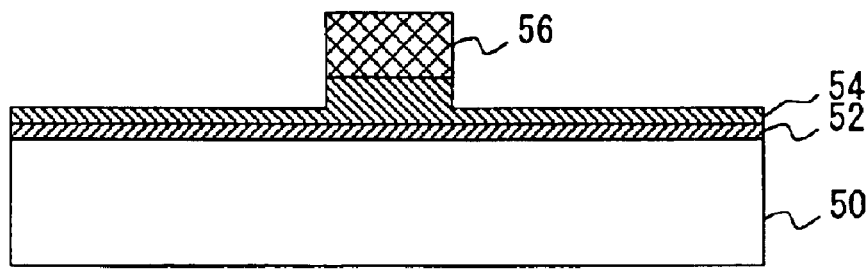
FIGS. 8A to 8D are schematic sectional views of the semiconductor substrate, showing another example of the processing steps described in a preferred embodiment according to the present invention.

Subsequently, a resist film is coated on the polysilicon layer 56 and patterned by a lithography technique using ArF excimer laser to form a resist layer 58, as shown in FIG. 7B. Thereafter, as shown in FIGS. 7C and 7D, the polysilicon layer 56 and high-k insulating film 54 are selectively dry-etched in this order using the resist layer 58 as a mask. As shown in FIG. 8A, when the high-k insulating film 54 is etched to an intermediate depth, the resist layer 58 is removed by SPM (a solution of sulfuric acid/hydrogen peroxide).

Figure 8B:
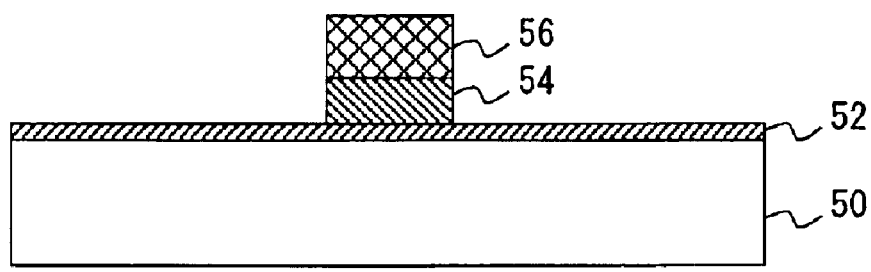
Figure 8C:
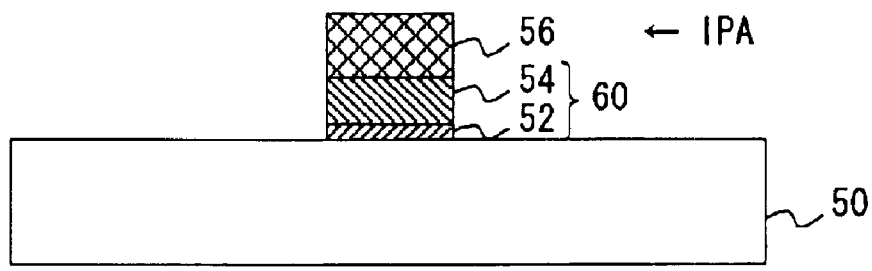

Subsequently, desired portions of the remaining high-k insulating film 54 and the silicon oxide film 52 are removed to form a gate electrode (FIGS. 8B and 8C). Although the embodiment employs DHF as an etching agent, instead, it may employ BHF. Further, when a solution of alcohols such as IPA with addition of fluorine compound, hot phosphoric acid or an aqueous solution of sulfuric acid is used to remove the desired portions thereof, damage to the other regions of the substrate, e.g., a field isolation film used in STI, can be prevented.

Then, the substrate is rinsed by moving the nozzles, as is explained in the description of the First Embodiment. In the embodiment, the first supply nozzle 33 shown in FIGS. 3A, 3B, 4A and 4B sprays DHF. The second supply nozzle 36 sprays through its orifice a gaseous mixture of vapor IPA supplied from the IPA container 34 and nitrogen gas. Accordingly, the DHF sprayed is replaced with the vapor IPA.

Figure 8D:
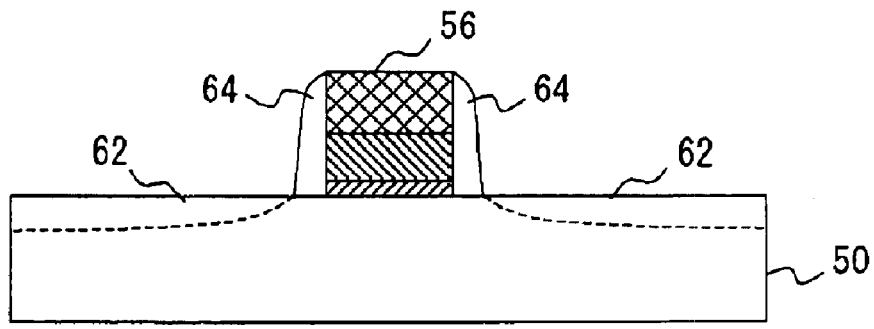

After the rinse, sidewalls 64 are formed and dopant ions are implanted to form impurity regions 62, resulting in formation of transistor (FIG. 8D). Thereafter, a metal layer is formed over the entire surface of the silicon substrate 50 and portions, contacting the polysilicon layer 56 and the impurity regions 62, of the metal layer are silicided, and then, portions, other than the silicided portions, of the metal layer are removed to form silicide layers on the gate electrode and source/drain regions (not shown).

In the process according to the embodiment, when the substrate shown in FIG. 8C is rinsed with pure water in accordance with the conventional technique, watermarks are potentially generated on the surface of the silicon substrate 50, leading to a difficulty in achieving a dopant profile as designed in the impurity region 62. Since rates at which oxide films are grown on the watermarks and portions other than the watermarks are different from each other, ion implantation conditions vary depending on locations of implanted ions on the substrate. On the contrary, the method according to the embodiment does not use pure water in a rinse step and instead, uses the Rotagoni™ drying technique utilizing DHF and vapor IPA in the rinse step for prevention of generation of watermarks. As such, the method according to the embodiment allows the impurity regions 62 to be formed as designed by ion implantation.

In addition, the resist layer 58 is removed while the high-k insulating film 54 is partially remained, as shown in FIGS. 7D and 8A. This prevents the silicon substrate from being damaged during the ashing of resist.

As described above, the embodiment allows stable manufacture of highly reliable transistors.

3. Third Embodiment

The embodiment illustrates the case where a transistor is formed in an I/O region of a substrate and the substrate is rinsed using the method according to the invention after formation of a gate of the transistor. A process according to the embodiment will be described with reference to FIGS. 9A, 9B and 10A–C.

Figure 9A:
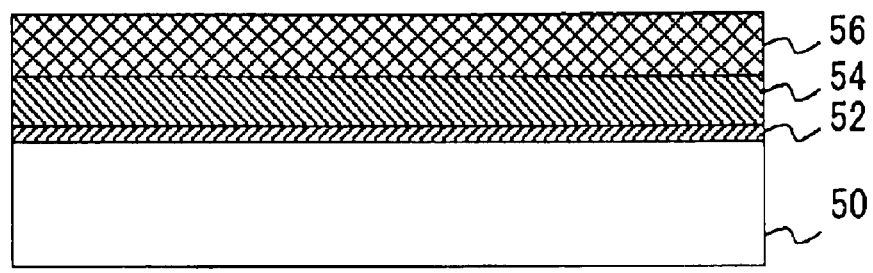
FIGS. 9A and 9B are schematic sectional views of the semiconductor substrate, showing another example of the processing steps described in a preferred embodiment according to the present invention.

First, as shown in FIG. 9A, a silicon substrate 50 is thermally oxidized to form a silicon oxide film 52 on the silicon substrate 50 and a high-k insulating film 54 is deposited thereon by CVD or sputtering, and further, a polysilicon layer 56 is deposited thereon by CVD.

Figure 9B:
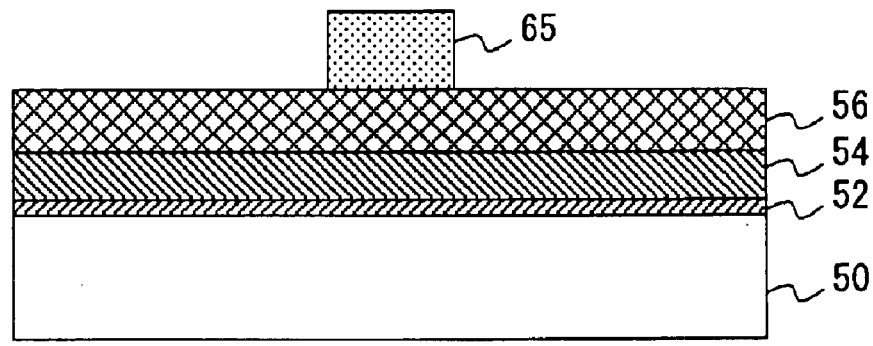
Figure 10A:
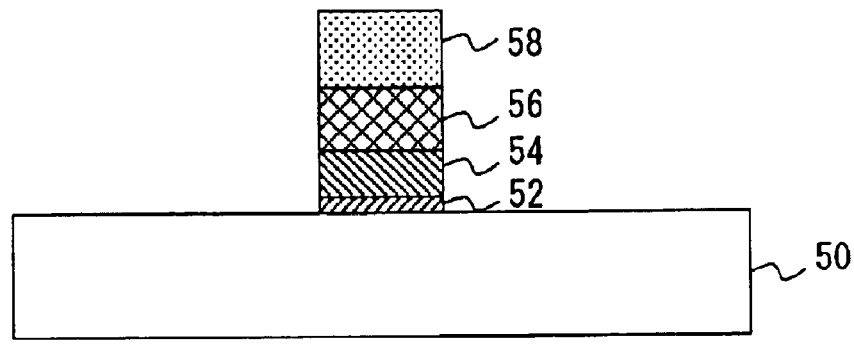
FIGS. 10A to 10C are schematic sectional views of the semiconductor substrate, showing another example of the processing steps described in a preferred embodiment according to the present invention.

Subsequently, a resist film is coated on the polysilicon layer 56 and patterned by a lithography technique using an I-beam (365 nm) to form a resist layer 65, as shown in FIG. 9B. Thereafter, the polysilicon layer 56, high-k insulating film 54 and the silicon oxide film 52 are selectively dry-etched using the resist layer 65 as a mask to form a gate electrode (FIG. 10A).

Figure 10B:
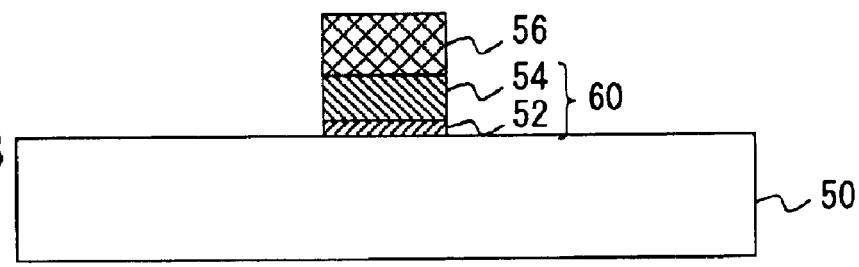

Next, the resist layer 65 is removed by dissolving the resist layer 65 with IPA and subsequently, the substrate is rinsed with vapor IPA (FIG. 10B). The above-stated operation is performed by the apparatus shown in FIGS. 3A, 3B, 4A and 4B and used in the first embodiment. Referring to FIGS. 3A and 3B, first, the third supply nozzle 32 supplies liquid IPA to the surface of the silicon wafer 37 to remove the resist. Next, the second supply nozzle 36 sprays vapor IPA onto the surface of the silicon wafer 37 while the second supply nozzle 36 is moved. Thereafter, the silicon wafer is rotated at high speed in a nitrogen atmosphere to blow the sprayed IPA and then dry the wafer. The rotational frequency of the wafer is set to, for example, 1,000 to 2,000 rpm.

Figure 10C:
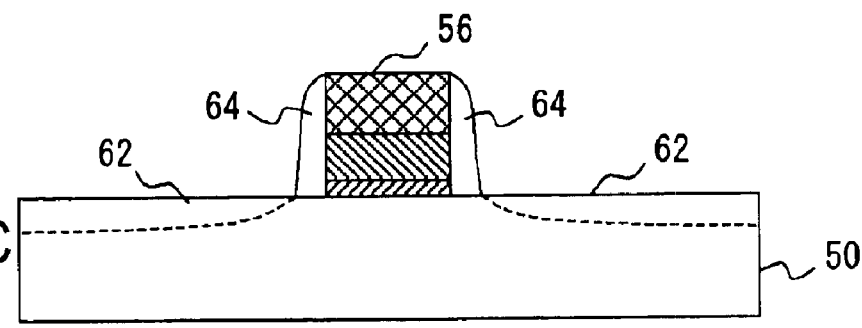
Figure 12:
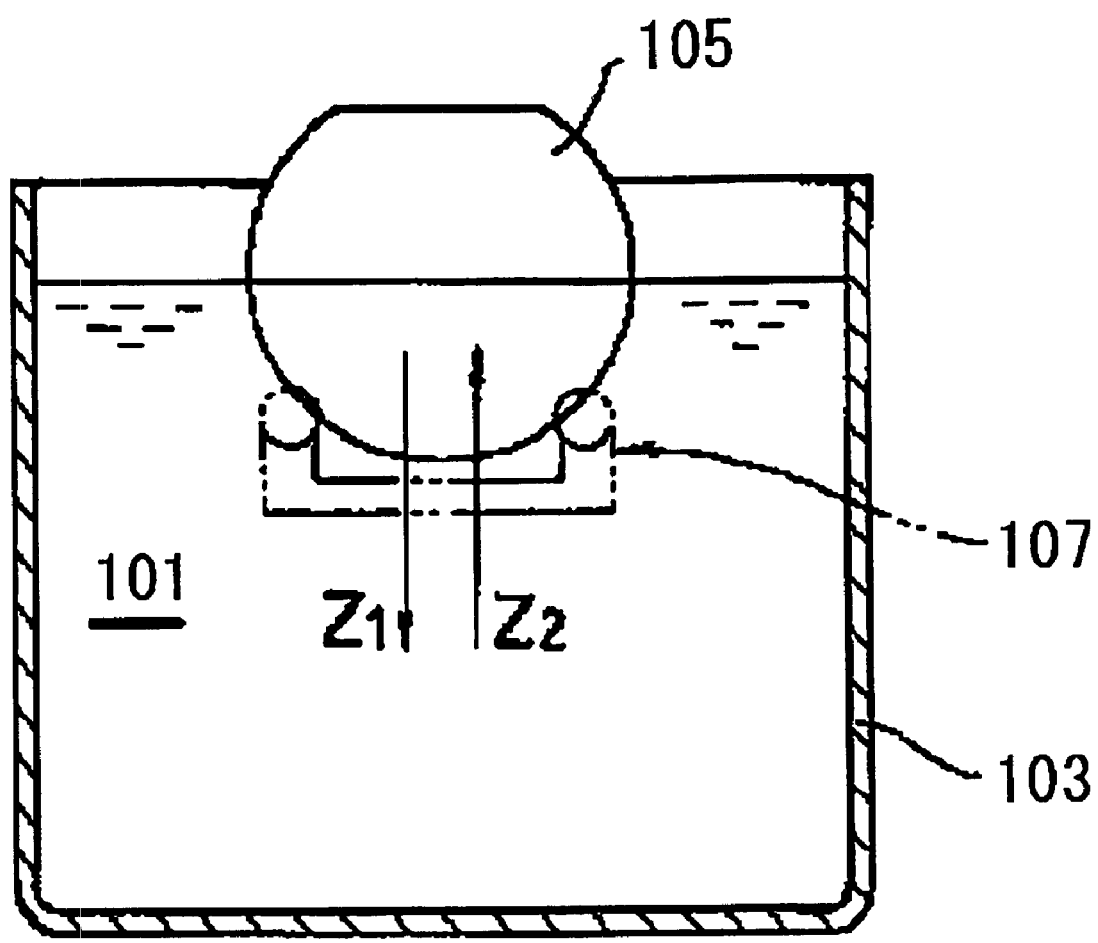
FIG. 12 is a schematic diagram of a prior art rinse processing apparatus.
Figure 13:
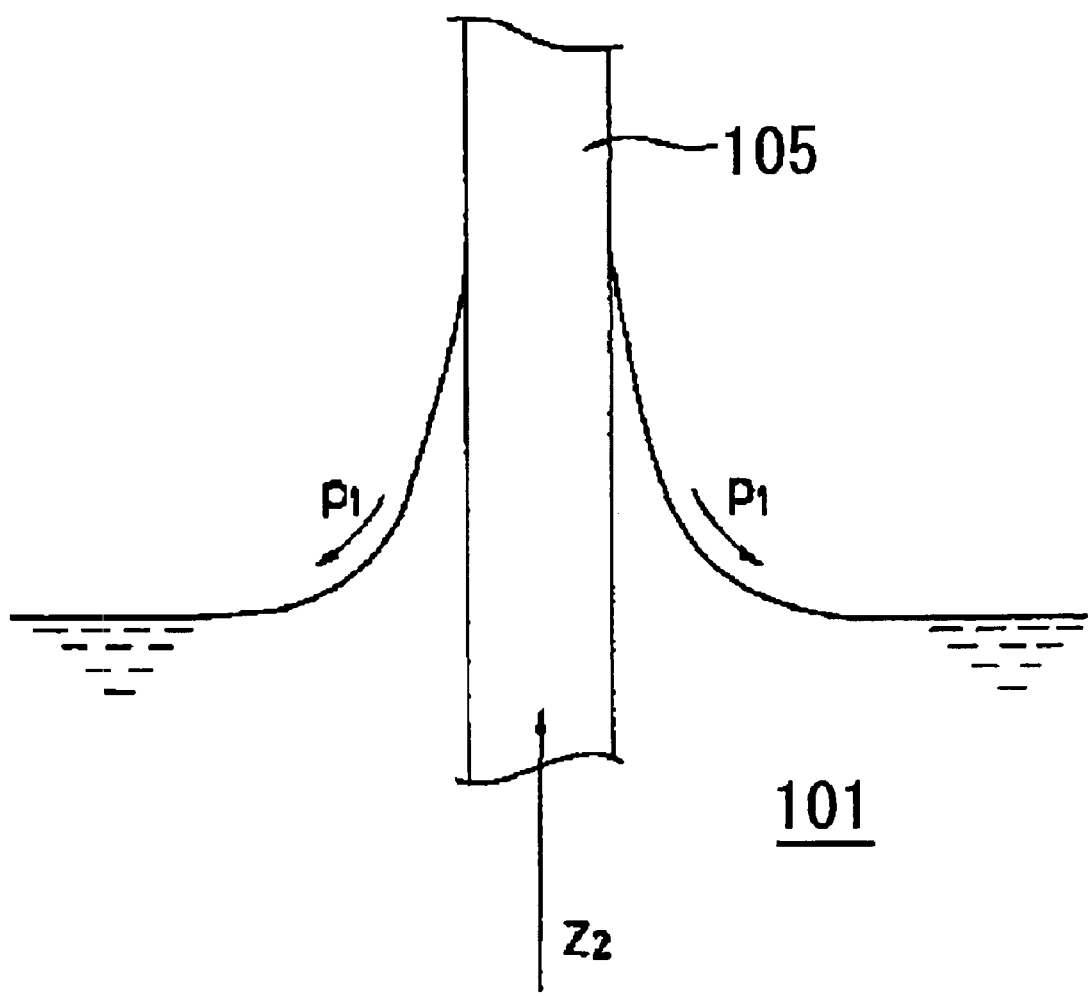
FIG. 13 is a enlarged view of a substrate and a chemical solution, showing the lifting process of the substrate.

After the rinse, sidewalls 64 are formed, and dopant ion are implanted to form impurity regions 62, resulting in formation of transistor (FIG. 10C). Thereafter, a metal layer is formed over the entire surface of the silicon substrate 50 and portions, contacting the polysilicon layer 56 and the impurity regions 62, of the metal layer are silicided, and then, portions, other than the silicided portions, of the metal layer are removed to form silicide layers on the gate electrode and source/drain regions, resulting in formation of transistor (not shown).

In the method according to the embodiment, a rinse step is performed not using pure water but using vapor IPA, thereby preventing generation of watermarks. As such, the method according to the embodiment allows the impurity regions 62 to be formed as designed by ion implantation.

EXAMPLE

In the example, a lower interconnect line made of copper and an upper interconnect line made of copper were connected through a via plug by a single damascene process to form a two level interconnect structure were and then the yield of chips each containing the two level interconnect structure is evaluated. In forming the interconnect structure, wafers to be evaluated were rinsed in various manners after formation of through-holes and removal of resist, and then, the wafers were evaluated in terms of how the rinse affect the yield of chips each containing the interconnect structure.

Samples for evaluation were manufactured in the following manner. A lower interconnect line and a via plug were formed in the manner similar to that described in the First Embodiment. First, a copper interconnect was formed on a silicon wafer. Then, a silicon nitride film having a thickness of 90 nm, a low-k film having a thickness of 450 nm and a silicon oxide film having a thickness of 450 nm are deposited. Next, a positive resist film was spin-coated thereon. In this case, a positive resist for KrF Excimer Laser Lithography was used as a material making up the resist film. The resist film was exposed through a mask pattern and developed using an aqueous solution of tetramethylammonium hydroxide to form a resist pattern. Note that instead of the resist for KrF Excimer Laser Lithography, a resist for ArF Excimer Laser Lithography may be used.

The silicon oxide film and the low-k film were dry-etched using the resist film as a mask to expose the silicon nitride film and then form a via hole having a diameter of 0.14 μm. In this case, a fluorocarbon-containing gas was used as an etching gas. After the etching, the resist film was partially removed by a low temperature oxygen plasma ashing and thereafter, was removed using an amine-containing stripping agent compound. After removal of the resist film, a rinse step and a dry step were performed in accordance with respective sequences shown in the tables in FIGS. 11A–C. The numerals listed in the tables indicate the order of the respective steps. For example, an example "No. 1" in FIG. 11A was manufactured in a sequence including: first, removing a resist film with a liquid stripper; rinsing a wafer with pure water; and drying the wafer with $N_2$ gas. Note that drying the wafer with $N_2$ gas was performed by was rotating the wafer at a frequency of 1,500 rpm for 1 minute in a nitrogen atmosphere. The abbreviation "DIW" described in FIG. 11B indicates deionized water.

After the above-described sequence, the via hole was filed with copper and an upper copper interconnect connected to the via hole was formed.

Figure 14A:
FIGS. 14A and 14B are plan view and cross sectional view, respectively, of a measurement model for chain resistance measured in the preferred embodiments according to the present invention.
Figure 14B:
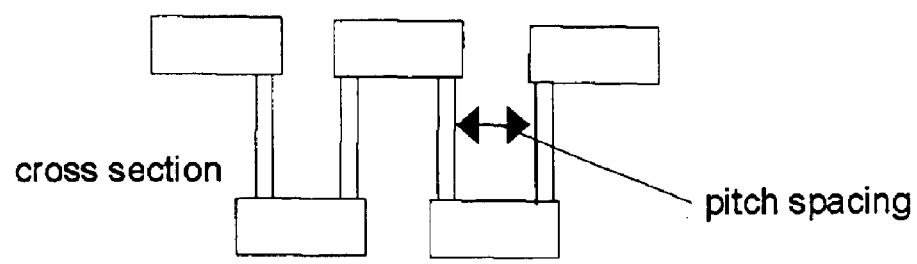

The two level interconnect structure thus obtained is referred to as a via chain and configured, as shown in FIG. 14, to include 500,000 via plugs and interconnect lines provided are on and under the via plugs, respectively. Both the interconnect lines and the via plugs were made of copper. The electrical resistance of an interconnect line consisting of the via plugs and the upper and lower interconnect lines was measured by applying a predetermined voltage between both ends of the via chain. The resistance measured is referred to as "chain resistance". The chain resistance is a useful measure for determination of whether the via plugs are normally connected to the upper and lower interconnect lines. In this example, the aforementioned via chain was formed on each of the chips on the silicon wafer and the resistance of the corresponding via chain was measured. When the resistance measured is not greater than a reference value, the chip having the corresponding via chain is determined to be "acceptable" and on the contrary, when the resistance measured is greater than the reference value, the chip having the corresponding via chain is determined as "non-acceptable". The ratio of "acceptable" chips to entire chips measured is referred to as "via yield".

The sequences shown in FIGS. 11A to 11C are characterized as follows:

(i) Sequences No. 1 and No. 2 (FIG. 11A)

Instead of rinse with pure water in the sequence No. 1 (comparative example), rinse with liquid IPA is carried out in the sequence No. 2. Thereafter, drying was carried out using $N_2$ gas in both sequences.

(ii) Sequences No. 3 and No. 4 (FIG. 11B)

In all of these sequences, predetermined chemical solution or vapor was supplied while nozzles for supplying solution or vapor were moved and then drying was carried out using Rotagoni™ drying technique. The sequence No. 3 (comparative example) was performed such that pure water is sprayed onto the wafer and the internal edge of residual droplet of liquid stripper was moved from the center of the wafer to the periphery thereof, which movement was due to the surface tension of the droplet, and subsequently, vapor IPA is sprayed onto the wafer. On the other hand, the sequence No. 4 was performed such that IPA is sprayed onto the wafer and the internal edge of residual droplet of liquid stripper was moved from the center of the wafer to the periphery thereof, which movement was due to the surface tension of the droplet, and subsequently, vapor IPA was sprayed onto the wafer.

(iii) Sequences No. 5 to No. 9 (FIG. 11C)

These sequences were performed such that in addition to processing in the aforementioned examples, the vapor IPA was sprayed onto the wafer while nozzles for supplying solution or vapor were moved.

The sequence No. 9 was performed such that electrolyte-containing water is sprayed onto the wafer and the internal edge of residual droplet of liquid stripper was moved from the center of the wafer to the periphery thereof, which movement was due to the surface tension of the droplet, and subsequently, vapor IPA was sprayed onto the wafer. A weak ammonia and hydrogen water solution (about pH 8.5) was used as electrolyte-containing water.

The via yield resulting from these sequences are: 60 to 70% for the sequences No. 1, NO. 3 and No. 5; 100% for the sequence No. 2; and 95% or higher for the sequences No. 2, No. 4, No. 7, No. 8 and No. 9.

Although the embodiments are explained as a case where the single damascene process is employed, needless to say, the present invention may be applicable to various other processes such as a dual damascene process.

According to the present invention, damages on a semiconductor substrate, a metal film and insulating film is formed on the substrate can be prevented when those components are cleaned. Also, the present invention provides a method for efficiently removing residual materials from the surface of substrate and after cleaning of the substrate, efficiently drying the substrate, thereby allowing increase in the throughput of substrate. Further, the present invention allows reduction in the production cost and the environmental load in a cleaning step while increasing the production yield.

What is claimed is:

1. A method of cleaning a semiconductor substrate, comprising:

(a) cleaning in a Single Wafer Processing Equipment a surface of a semiconductor substrate not using ultra-pure water rinse, comprising spraying a chemical solution onto the semiconductor substrate while rotating said semiconductor substrate, the chemical solution comprising a liquid organic solvent as a main component and a vapor of said organic solvent.

2. The method according to claim 1, further comprising, before the step (a), forming a film on said semiconductor substrate and partially removing said film.

3. The method according to claim 1, further comprising, before the step (a), depositing a metal film and an insulating film on the semiconductor substrate in this order and partially removing said insulating film to expose at least a part of a surface of said metal film.

4. The method according to claim 1, wherein in the step (a), a portion of said cleaning solution sprayed onto said surface is moved from a center of said substrate to a periphery of said substrate.

5. The method according to claim 1, wherein the step (a) is performed as a rinse step after wet processing and wherein the step (a) includes simultaneously spraying a liquid having resistivity lower than that of pure water and said cleaning solution onto said surface of said substrate, and wherein in the step (a), portions of the liquid sprayed onto said surface are moved from a center of said substrate to a periphery of said substrate while portions of said cleaning solution sprayed onto said surface are kept at a position at said center of said substrate.

6. The method according to claim 1, wherein said semiconductor substrate is a silicon wafer.

7. The method according to claim 1, wherein said surface of said semiconductor substrate includes an exposed portion of a semiconductor material.

8. The method according to claim 1, wherein said surface of said semiconductor substrate includes an exposed portion of a metal material.

9. The method according to claim 1, wherein said organic solvent is selected from the group consisting of isopropyl alcohol, ethylene glycol, cyclopentanone, methylethylketone and glycol ether.

10. The method according to claim 1, further comprising, after the step (a), drying said surface of said semiconductor substrate by rotating said semiconductor substrate in an inert gas atmosphere.

* * * * *